(12) United States Patent
Fukuda et al.

(10) Patent No.: US 7,506,548 B2
(45) Date of Patent: Mar. 24, 2009

(54) PRESSURE SENSOR PACKAGE STRUCTURE

(75) Inventors: Tetsuya Fukuda, Niigata-ken (JP);
Katsuya Kikuiri, Niigata-ken (JP);
Kiyoshi Sato, Niigata-ken (JP); Mitsuru Watanabe, Niigata-ken (JP); Yoshinobu Nakamura, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/865,479

(22) Filed: Oct. 1, 2007

(65) Prior Publication Data

US 2008/0078251 A1    Apr. 3, 2008

(30) Foreign Application Priority Data

Oct. 2, 2006    (JP) .............................. 2006-271001

(51) Int. Cl.
*G01L 7/00*    (2006.01)
(52) U.S. Cl. ........................................................ 73/756
(58) Field of Classification Search ................... 73/700, 73/756
See application file for complete search history.

(56) References Cited

U.S. PATENT DOCUMENTS 5,125,275 A * 6/1992 Wilda et al. .................... 73/756
5,438,877 A * 8/1995 Vowles et al. ................. 73/756
5,811,684 A * 9/1998 Sokn ............................. 73/706
5,831,170 A * 11/1998 Sokn ............................. 73/706
5,874,679 A * 2/1999 Sokn ............................. 73/706
5,996,419 A * 12/1999 Sokn ............................. 73/706

FOREIGN PATENT DOCUMENTS

| JP | 09-101220 | 4/1997 |
|---|---|---|
| JP | 09-280985 | 10/1997 |
| JP | 2000-352538 | 12/2000 |

OTHER PUBLICATIONS

Office Action issued in corresponding Japanese Patent Application No. 2006-271001; issued Dec. 2, 2008.

* cited by examiner

*Primary Examiner*—Andre J Allen
(74) *Attorney, Agent, or Firm*—Brinks Hofer Gilson & Lione

(57) ABSTRACT

A package is mainly formed of a package body having a storage area for storing a pressure sensor, a capacity type pressure sensor stored in the storage area of the package body, a lid seals the package body in which the pressure sensor is stored, an adhesive agent for fixing the pressure sensor to the package body, and a bonding wire for electrically coupling a bonding pad of the pressure sensor and a conductive portion of the package body. An adhesive area of the package body and the pressure sensor is set to the area other than a projection area of the diaphragm of the pressure sensor on a mount bottom surface. This makes it possible to provide the package for the pressure sensor capable of detecting the pressure with high sensitivity although the gap between the substrate and the diaphragm has the value with the magnitude of several μms.

8 Claims, 2 Drawing Sheets

PRESSURE SENSOR PACKAGE STRUCTURE

CLAIM OF PRIORITY

This application claims benefit of the Japanese Patent Application No. 2006-271001 filed on Oct. 2, 2006, which is hereby incorporated by reference.

BACKGROUND

1. Field of the Invention

The present invention relates to a package for storing a pressure sensor such as a capacitance type pressure sensor.

2. Description of the Related Art

Recently, a capacitance type pressure sensor and a piezo type pressure sensor have been developed to be mounted on various types of the devices. Normally, this type of sensor is required to be packaged with a ceramic package and the like so as to be mounted on the device.

For example, for the purpose of packaging the pressure sensor, an adhesive agent (die bonding agent) is applied over an entire bottom surface of the package, on which the pressure sensor is mounted and adhered (die bonded) on the bottom surface of the package with the adhesive agent, for example as disclosed in Japanese Unexamined Patent Application Publication No. 9-101220.

With this type of process for packaging, the difference in the thermal expansion coefficient between the material for forming the sensor and the material for forming the package may influence the sensor's characteristics. Assuming that the sensor is formed of silicon, which exhibits the thermal expansion coefficient of about 3 to $3.5 \times 10^6$/K, and the package is formed of alumina, which exhibits the thermal expansion coefficient of about $8 \times 10^6$/K, as the thermal expansion coefficient of the material for forming the package is larger, the sensor is adversely affected because of the influence of the thermal expansion of the package. Thus the temperature characteristics of the sensor are deteriorated. Especially in the case where the pressure sensor is sized to have the gap between the substrate and the diaphragm with a ga[ magnitude of several □ms, the resultant thermal expansion may deform the diaphragm, thus failing to accurately detect the pressure.

SUMMARY

A package is disclosed for a pressure sensor that includes a package body having a mount bottom surface on which a pressure sensor with a diaphragm is mounted, a pressure sensor adhered at an area other than a projection area of the diaphragm on the mount bottom surface of the package body, and a lid member for sealing the package body.

In this structure, the adhesive area of the package body and the pressure sensor on the mount bottom surface is set to the area other than the projection area of the diaphragm of the pressure sensor. Accordingly, no adhesive agent exists below the projection area of the diaphragm of the pressure sensor. Although the difference in the thermal expansion coefficient between the material for forming the package body and the material for forming the pressure sensor becomes relatively large, the thermal expansion does not deform the diaphragm, thus preventing the diaphragm deformation under the influence other than the pressure. As a result, the diaphragm of the pressure sensor is deformed under the influence of only the pressure. This makes it possible to accurately detect the pressure.

DESCRIPTION OF THE EMBODIMENTS

Figure 1:
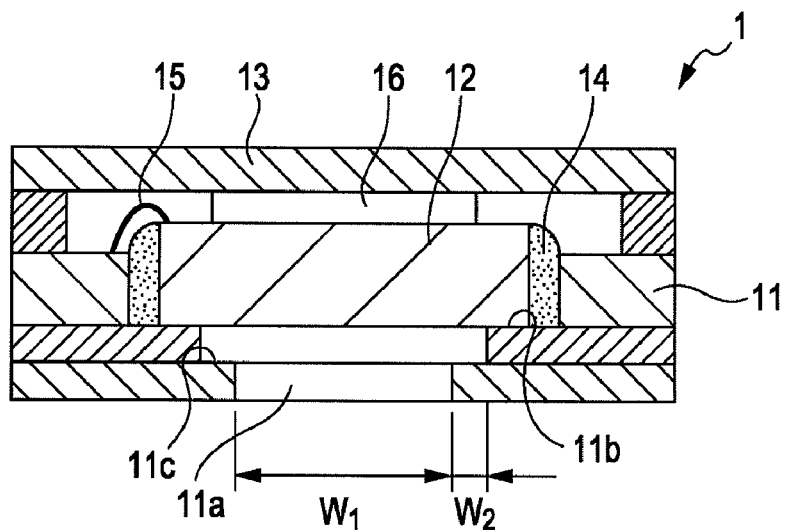
FIG. 1 is a sectional view of a package for a pressure sensor according to an embodiment.

Embodiments of the present invention will be described referring to the drawings.

Figure 2:
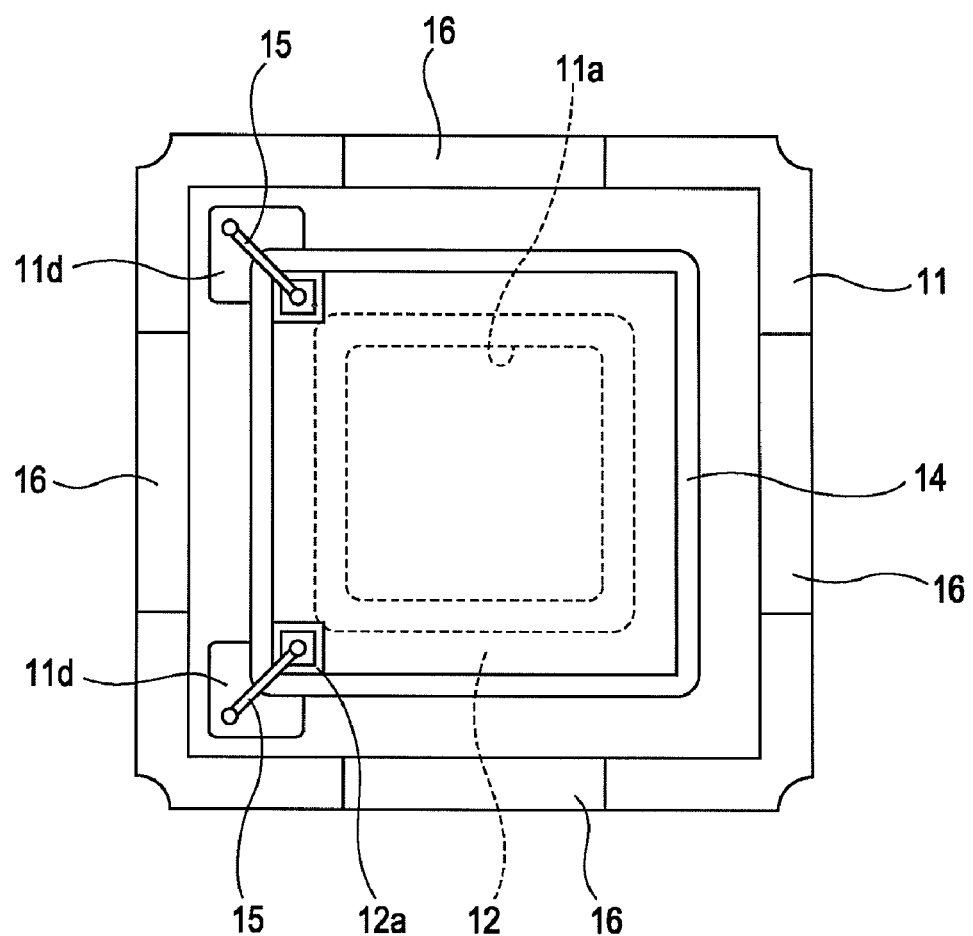
FIG. 2 is a plan view of the package for the pressure sensor according to the embodiment of FIG. 1.

FIG. 1 is a sectional view of a package for a pressure sensor according to an embodiment. FIG. 2 is a plan view of the package for the pressure sensor according to the embodiment of FIG. 1. FIG. 2 shows the package in the state where a lid member is removed.

A package 1 for a pressure sensor shown in FIG. 1 is mainly comprised of a package body 11 having a storage area for storing the pressure sensor, a capacity type pressure sensor 12 having a diaphragm (not shown) and stored in the storage area of the package body, a lid member 13 which seals the package body in which the pressure sensor 12 is stored, an adhesive agent 14 for bonding the pressure sensor 12 onto the package body 11, and a bonding wire 15, which electrically couple a bonding pad 12a of the pressure sensor 12 and a conductive portion 11d of the package body 11.

The package body 11 is preferably formed of a ceramic material such as alumina, and has the storage area large enough to store the pressure sensor 12. The package body 11 has a mount bottom surface 11b on which the pressure sensor 12 is mounted in the storage area. Preferably a width $W_1$ of an opening 11a formed in the mount bottom surface 11b is set to a value larger than that of the diaphragm of the pressure sensor 12 (described below). By setting the width as described above, the adhesive agent 14 for adhering the pressure sensor 12 onto the package body 11, which flows into the mount bottom surface may be prevented from residing below the pressure sensor 12. This makes it possible to further reduce the influence of that the adhesive agent 14 gives to the pressure sensor 12. The opening 11a serves as a passage (air vent) through which air caught in the flow of the adhesive agent 14 may be discharged.

The mount bottom surface 11b of the package body 11 includes a stepped portion 11c. The stepped portion 11c serves to prevent the adhesive agent 14 for adhering the pressure sensor to be directed to the mount bottom surface from flowing to the bottom surface of the package. The stepped portion 11c serves to catch the adhesive agent 14 flowing from the side surface of the pressure sensor 12 to the mount bottom surface side with the surface tension, thus preventing the flow of the adhesive agent to the package bottom surface. A width $W_2$ of the stepped portion 11c may be set to about 0.1 mm, for example.

A pressure sensor equipped with a diaphragm is employed as the pressure sensor 12. A capacitance type pressure sensor formed by bonding a glass substrate having a fixed electrode to a silicon substrate with a diaphragm disposed at a predetermined interval from the fixed electrode may be employed, for example.

A UV cure adhesive agent may be employed as the adhesive agent 14. The adhesive area of the package body 11 and the pressure sensor 12 is set to the area on the mount bottom surface 11b other than the projection area of the diaphragm of the pressure sensor 12. That is, no adhesive agent exists below the projection area of the diaphragm of the pressure sensor 12. Although the difference in the thermal expansion coefficient between the material for forming the package body 11 and the material for forming the pressure sensor is relatively large, the diaphragm is not deformed by the thermal expansion. This makes it possible to prevent deformation of the diaphragm because of influences other than the pressure.

Preferably, at least two areas on the mount bottom surface 11b of the package body 11 are set as the area other than the projection area of the diaphragm. At least two corners or preferably four corners of the bottom surface of the pressure sensor 12 on the mount bottom surface may be included as the area other than the projection area of the diaphragm. The adhesive area of the package body 11 and the pressure sensor 12 may be set to the area formed by joining the mount bottom surface 11b and the side surface of the pressure sensor 12 so long as it is set to the area other than the projection area of the diaphragm of the pressure sensor 12 on the mount bottom surface 11b.

A ceramic material, such as alumina, and a metal, such as kovar, may be employed for forming the lid member 13. The package body 11 and the lid member 13 are preferably bonded together with the adhesive agent. A pressure inlet port 16 is formed as shown in FIGS. 1 and 2.

The adhesive agent is applied to four corners of the bottom surface of the pressure sensor 12 so as to be mounted on the mount bottom surface 11b of the package body 11. The adhesive agent is then injected to the side surface of the pressure sensor 12, and left cured in the aforementioned state to fix the pressure sensor 12 on the package body 11. The bonding pad 12a of the pressure sensor 12 is bonded to the conductive portion 11d of the package body 11 via the bonding wire 15. The lid member 13 is adhered onto the upper surface of the package body 11.

As the adhesive area of the package body 11 and the pressure sensor 12 is set to the area on the mount bottom surface 11b other than the projection area of the diaphragm of the pressure sensor 12, no adhesive agent exists below the projection area of the diaphragm of the pressure sensor 12. Although the difference in the thermal expansion coefficient between the material for forming the package body 11 and the material for forming the pressure sensor is relatively large, the diaphragm is not influenced by the thermal expansion, preventing deformation of the diaphragm under the influence other than the pressure. As the diaphragm of the pressure sensor 12 is deformed under the influence of pressure only, the pressure may be detected accurately. The use of the above-structured package is especially effective for the capacity type pressure sensor produced through MEMS (Micro Electro Mechanical Systems) with the gap of about several □ms or less than about 1 □m which fails to detect the pressure owing to deformation of the diaphragm under the influence other than the pressure.

Embodiments of the present invention will next be described.

First Embodiment

A pressure sensor is adhered to the package body at four corners of the side surface of the pressure sensor as shown in FIG. 1. The bonding pad of the pressure sensor is bonded to the conductive portion of the package body via the bonding wire. The lid member is adhered onto the upper surface of the package body. The package of the first embodiment, thus, is produced. The package body and the lid member are formed of alumina. The capacitance type pressure sensor with the diaphragm (gap: 0.3 □m) is employed as the pressure sensor. The UV cure adhesive agent is employed as the adhesive agent.

Second to Sixth Embodiment

Packages according to second to sixth embodiments are produced, each having the same structure as that of the first embodiment except the area where the pressure sensor 12 is adhered onto the package body 11. The adhesive area in the second embodiment is set to four corners of the bottom surface of the pressure sensor 12. The adhesive area in the third embodiment is set to two adjacent corners of the side surface of the pressure sensor 12. The adhesive area in the fourth embodiment is set to two adjacent corners of the bottom surface of the pressure sensor 12. The adhesive area in the fifth embodiment is set to two opposite corners of the side surface of the pressure sensor 12. The adhesive area in the sixth embodiment is set to two opposite corners of the bottom surface of the pressure sensor 12.

COMPARATIVE EXAMPLE

The entire bottom surface of the pressure sensor is adhered to the package body having the mount bottom surface with no opening. The bonding pad of the pressure sensor is bonded to the conductive portion of the package body via the bonding wire. The lid member is then adhered onto the upper surface of the package body to produce the package as the comparative example. The alumina is employed for forming the package body and the lid member. The capacitance type pressure sensor (gap: 1 □m) with the diaphragm is employed as the pressure sensor. The UV cure adhesive agent is employed as the adhesive agent.

Figure 3:
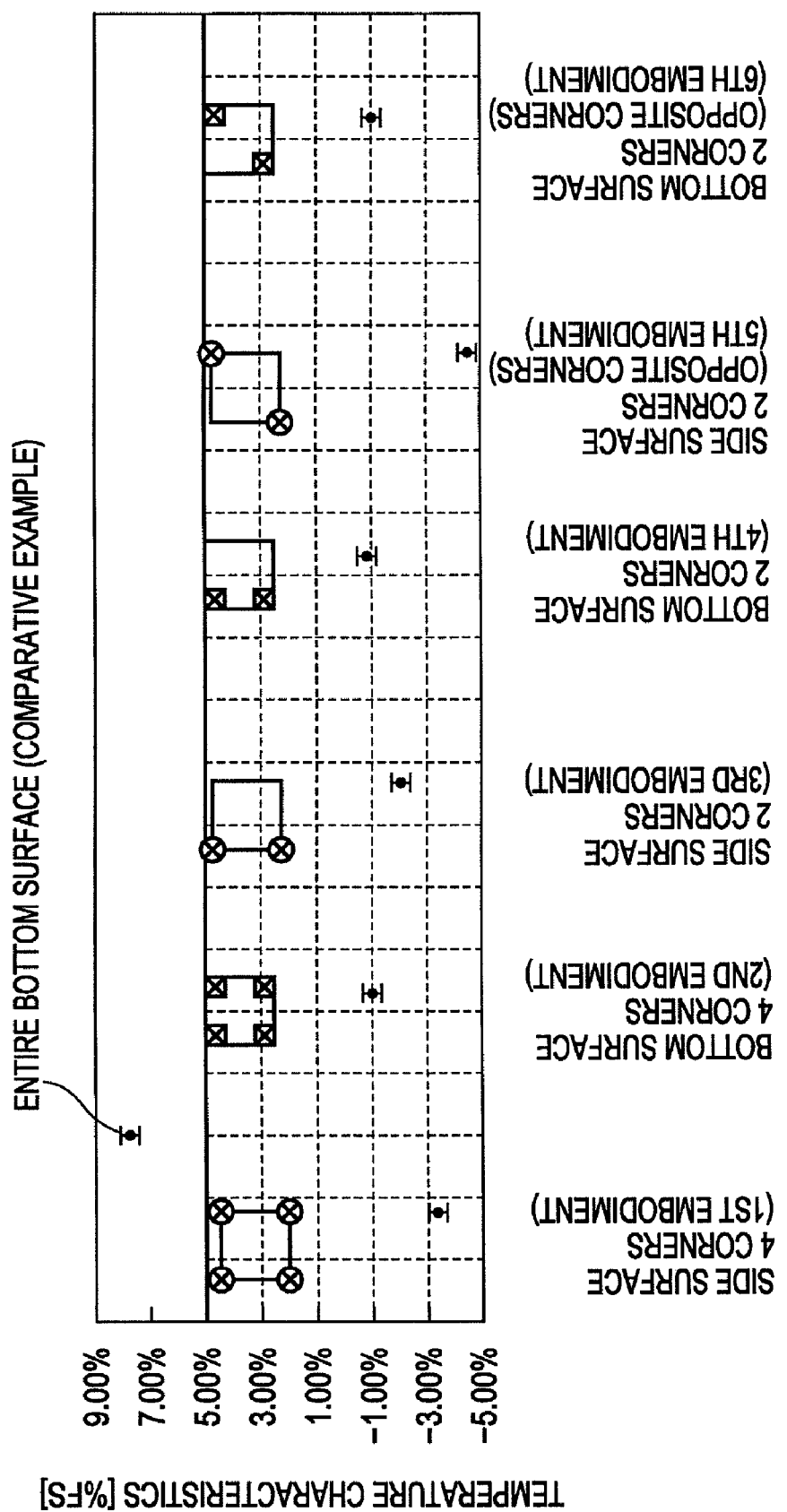
FIG. 3 is a view showing temperature characteristics of the pressure sensors of the packages according to embodiments of the present invention.

The respective temperature characteristics of the thus produced packages according to the first to the sixth embodiments and the comparative example were obtained and shown in FIG. 3. The temperature characteristics were obtained by measuring the capacitance of the packaged sample in the thermostatic chamber set at the measurement temperature with the LCR meter.

Referring to FIG. 3, the adhesive area of the package body and the pressure sensor of each package according to the first to the sixth embodiments is set to the area other than the projection area of the diaphragm of the pressure sensor on the mount bottom surface. The package, thus, is not influenced by the thermal expansion, and observed excellent temperature characteristics. As the adhesive area of the package body and the pressure sensor of the package as the comparative example is set to the entire bottom surface of the pressure sensor, the package is influenced by the difference in the thermal expansion coefficient between the materials for forming the respective components, and observed deteriorated temperature characteristic.

It is to be understood that the present invention is not limited to the aforementioned embodiments, but may be modified into various forms. The values or materials which have been explained in the aforementioned embodiment are not limited. The process for adhesion and bonding in the embodiments may be performed under the generally employed conditions. The process which has been explained in the aforementioned embodiments is not limited to the one as described above, but may be allowed to change the order of the respective steps of the process. The present invention may be modified so long as it does not deviate from the scope of the present invention.

The present invention may be applied to the package for the pressure sensor used for detecting floating of the head in the hard disk drive, for example.

What is claimed is:

1. A pressure sensor package comprising:
    a pressure sensor;
    a package body having a storage area for storing the pressure sensor;
    a lid member which seals the package body in a state in which the pressure sensor is stored in the storage area of the package body; and
    a mount bottom surface on which the pressure sensor is mounted in the storage area,
    wherein the mount bottom surface has an opening, an external size of the opening being smaller than an external size of the pressure sensor, and
    wherein the pressure sensor is adhered to the mount bottom surface at least at a corner of the pressure sensor.

2. The pressure sensor package according to claim 1, wherein the opening has a step so that a dimension of the opening reduces as a distance from the pressure sensor increases.

3. The pressure sensor package according to claim 1, wherein the pressure sensor is adhered to the mount bottom surface at four corners of a side surface of the pressure sensor.

4. The pressure sensor package according to claim 1, wherein the pressure sensor is adhered to the mount bottom surface at four corners of a bottom surface of the pressure sensor.

5. The pressure sensor package according to claim 1, wherein the pressure sensor is adhered to the mount bottom surface at two adjacent corners of a side surface of the pressure sensor.

6. The pressure sensor package according to claim 1, wherein the pressure sensor is adhered to the mount bottom surface at two adjacent corners of a bottom surface of the pressure sensor.

7. The pressure sensor package according to claim 1, wherein the pressure sensor is adhered to the mount bottom surface at two diagonal corners of a side surface of the pressure sensor.

8. The pressure sensor package according to claim 1, wherein the pressure sensor is adhered to the mount bottom surface at two diagonal corners of a bottom surface of the pressure sensor.

* * * * *